United States Patent
Kim et al.

(10) Patent No.: US 11,907,064 B2
(45) Date of Patent: Feb. 20, 2024

(54) MEMORY CONTROLLER AND MEMORY SYSTEM INCLUDING THE SAME

(71) Applicant: SAMSUNG ELECTRONICS CO., LTD., Suwon-si (KR)

(72) Inventors: Ho-Youn Kim, Seoul (KR); Su Hun Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 154 days.

(21) Appl. No.: 17/697,530

(22) Filed: Mar. 17, 2022

(65) Prior Publication Data
US 2023/0076545 A1    Mar. 9, 2023

(30) Foreign Application Priority Data

Sep. 8, 2021 (KR) .................. 10-2021-0119579

(51) Int. Cl.
*G06F 11/10* (2006.01)
*G06N 3/04* (2023.01)
*G06F 11/07* (2006.01)

(52) U.S. Cl.
CPC ........ *G06F 11/1068* (2013.01); *G06F 11/076* (2013.01); *G06F 11/0757* (2013.01); *G06F 11/0772* (2013.01); *G06F 11/106* (2013.01); *G06N 3/04* (2013.01)

(58) Field of Classification Search
CPC ............. G06F 11/1068; G06F 11/0757; G06F 11/076; G06F 11/0772; G06F 11/106; G06N 3/04
See application file for complete search history.

(56) References Cited

U.S. PATENT DOCUMENTS

| 9,196,383 | B2 | 11/2015 | Dang et al. |
| 9,728,276 | B2* | 8/2017 | Chang .................. G06F 18/217 |
| 9,891,975 | B2 | 2/2018 | Komatsu et al. |
| 10,387,234 | B2* | 8/2019 | Paterson ............. G06F 11/0757 |
| 10,635,324 | B1 | 4/2020 | Klein et al. |
| 10,644,892 | B2 | 5/2020 | Afghah et al. |
| 10,802,728 | B2 | 10/2020 | Lee et al. |
| 10,896,114 | B2 | 1/2021 | Savanur |
| 11,036,572 | B2 | 6/2021 | Liu et al. |
| 11,132,248 | B2* | 9/2021 | Xu ...................... G06F 11/0709 |
| 2007/0055914 | A1* | 3/2007 | Chandwani ......... G06F 11/0715 714/E11.02 |
| 2007/0088974 | A1* | 4/2007 | Chandwani ......... G06F 11/0781 714/6.11 |
| 2019/0108888 | A1* | 4/2019 | Sarkar .................. G06F 3/0616 |
| 2019/0163532 | A1* | 5/2019 | Kim ..................... G06F 9/5016 |

(Continued)

*Primary Examiner* — Guy J Lamarre
(74) *Attorney, Agent, or Firm* — Fish & Richardson P.C.

(57) ABSTRACT

A memory controller includes a fault predictor which predicts a fault which causes an error occurring in a memory device, an error correction code (ECC) manager which classifies a type of the fault based on the predicted fault, and a plurality of ECC engines which perform ECC in parallel depending on the classified type of the faults. The fault predictor includes a memory error profiler which receives raw data related to the error and processes the raw data into an error profile that is data available for machine learning, and a memory fault prediction network which receives the error profile as an input, performs the machine learning using the error profile, and predicts the fault which causes the error.

20 Claims, 12 Drawing Sheets

(56) References Cited

U.S. PATENT DOCUMENTS

| | | |
|---|---|---|
| 2019/0278648 A1* | 9/2019 | Nayak .................. G06F 11/008 |
| 2021/0109660 A1 | 4/2021 | Kim et al. |
| 2021/0124502 A1 | 4/2021 | Elyasi et al. |
| 2023/0083193 A1* | 3/2023 | Zhou ...................... G11C 29/52 |
| | | 714/42 |
| 2023/0152805 A1* | 5/2023 | Bramley ................ G06V 10/82 |
| | | 706/15 |

* cited by examiner

114b

MEMORY CONTROLLER AND MEMORY SYSTEM INCLUDING THE SAME

CROSS-REFERENCE TO RELATED APPLICATION

This application is based on and claims the benefit of priority under 35 U.S.C. § 119 to Korean Patent Application No. 10-2021-0119579, filed on Sep. 8, 2021 in the Korean Intellectual Property Office, the disclosure of which is incorporated herein by reference in its entirety.

BACKGROUND

1. Field

The present disclosure relates to a memory controller and a memory system including the same.

2. Description of the Related Art

Fault of a memory device may be one of common factors of error occurrence in the memory device. Defective memory devices may include defective memory chips or defective data passages provided between the memory devices inside a memory system. The defective data passages may occur, for example, due to defective pins, defective data traces or twisted fault wires.

Faults are analyzed through preliminary tests when developing the memory device, but it is difficult to actively cope with the faults that appear when the memory device is used.

Therefore, it is necessary to positively predict a fault that will occur in the memory device, based on the error that occurs in the data inside the memory device.

SUMMARY

According to an aspect of the inventive concept(s) described herein, a memory controller includes a fault predictor, an error correcting code (ECC) manager, and a plurality of ECC engines. The fault predictor predicts a fault which causes an error occurring in a memory device. The ECC manager classifies a type of the fault based on the predicted fault. The plurality of ECC engines perform ECC in parallel depending on the classified type of the fault. The fault predictor includes a memory error profiler and a memory fault prediction network. The memory error profiler receives raw data related to the error and processes the raw data into an error profile that is data available for machine learning. The memory fault prediction network receives the error profile as an input, performs the machine learning using the error profile, and predicts the fault which causes the error.

According to an aspect of the inventive concept(s) described herein, a memory device includes a memory cell array and a memory controller. The memory cell array includes a plurality of memory cells for storing data. The memory controller controls an access to the memory cell array. The memory controller includes a fault predictor, a memory fault prediction network and an ECC manager. The fault predictor includes a memory error profiler and a memory fault prediction network. The memory error profiler receives raw data related to an error occurring in the data and processes the raw data into an error profile that is data available for machine learning. The memory fault prediction network receives the error profile as an input and performs the machine learning using the error profile to predict a fault that causes the error. The ECC manager classifies the type of faults based on the predicted fault.

According to an aspect of the inventive concept(s) described herein, a memory system includes a memory device and a memory controller. The memory device includes a memory cell array including a plurality of memory cells for storing data. The memory controller includes a fault predictor, an ECC manager, and a plurality of ECC engines. The fault predictor predicts a fault that causes an error occurring in the memory device. The ECC manager classifies the type of the faults based on the predicted defect. The plurality of ECC engines perform ECC in parallel depending on the classified type of the fault. The fault predictor includes a memory error profiler that receives raw data related to an error occurring in the data and processes the raw data into an error profile that is data available for machine learning, and a memory fault prediction network that receives the error profile as an input and performs the machine learning using the error profile to predict a fault that causes the error.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
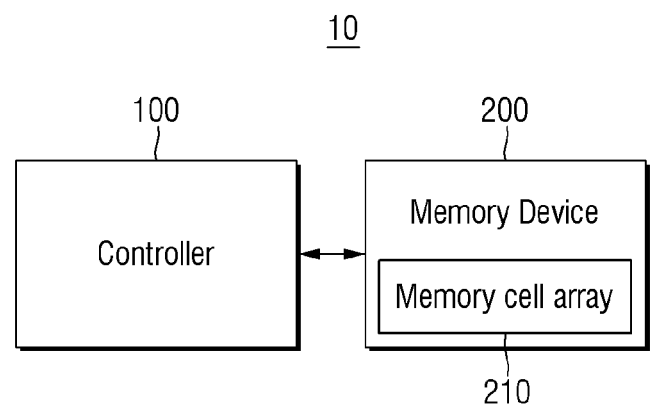
FIG. 1 is an exemplary block diagram showing a memory system according to some embodiments.

FIG. 1 is an exemplary block diagram showing a memory system according to some embodiments.

Referring to FIG. 1, a memory system 10 according to some embodiments includes a memory controller 100 and a memory device 200.

The memory controller 100 may generally control the operation of the memory system 10 including the memory device 200. The memory controller 100 may analyze commands provided from a host (not shown), and control the overall operation of the memory device 200 according to the analysis result.

Although not shown, the memory controller 100 may include a memory interface that communicates with the memory device 200. The memory interface may be compatible with numerous memory technologies such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (Wide102), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC) and/or others, and technologies based on derivatives or extensions of these specifications.

The memory device 200 may include a memory cell array 210 including a plurality of memory cells for storing data.

The plurality of memory cells for storing data may be, but are not limited to, a DRAM, a SDRAM, or a SRAM (Static Random Access Memory).

An error may occur in the data stored in the memory cell array 210 inside the memory device 200. The error occurring in the data may be a temporary error or a continuous error.

For example, the temporary error (or soft error) may be caused by cosmic radiation or an environment that randomly affects data bits. Such errors may usually be limited to single bits or single columns.

In contrast, the continuous error (or hard error) may be caused by fault of the memory device 200. Such continuous errors may be limited to single bits or single columns. In addition, the continuous errors (or hard errors) may affect all memory cells present in the memory cell array 210.

Fault that occurred in the memory device 200 is analyzed through a preliminary test or the like at the time of development of the memory device 200, and the test information may be reflected in the memory device 200. However, the memory system 10 may be difficult to actively cope with the fault that appears in the process of using the memory device 200 or the memory system 10 by the user.

Therefore, it is possible to predict a fault that occurred in the memory device 200 and to actively cope with the defect, based on an error occurring in the data received from the memory cell array 210 through the memory controller 100.

The configuration and operation of the memory controller 100 according to some embodiments will be described referring to FIG. 2 to FIG. 9 below.

Figure 2:
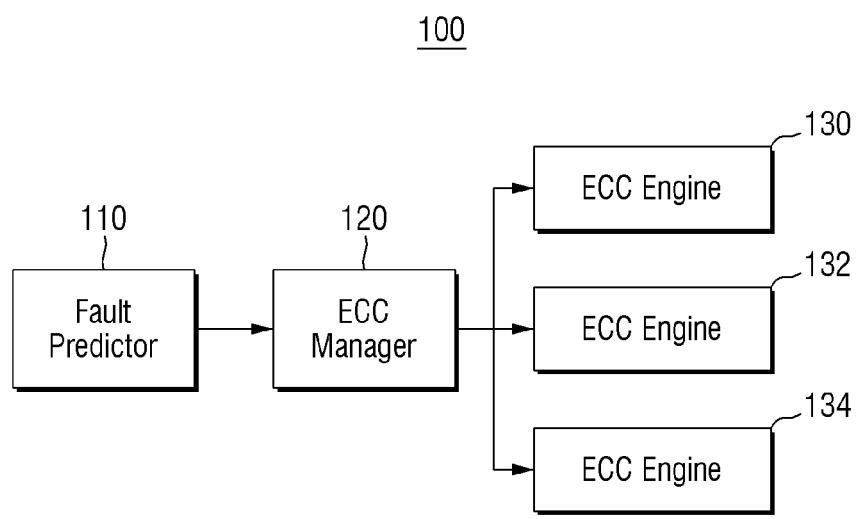
FIG. 2 is an exemplary block diagram showing a memory controller according to some embodiments.

FIG. 2 is an exemplary block diagram showing a memory controller according to some embodiments.

Before proceeding, it should be clear that Figures herein, including FIG. 2, show and reference circuitry with labels such as "predictor", "manager", "engine", "profiler", "fault prediction network", "module", "precoder", "generator", "corrector" or similar terms analogous to "circuit" or "block". As is traditional in the field of the inventive concept(s) described herein, examples may be described and illustrated in terms of such labelled elements which carry out a described function or functions. These labelled elements, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting such labelled elements may be implemented by dedicated hardware, or by a processor (e.g., one or more programmed microprocessors and associated circuitry), or by a combination of dedicated hardware to perform some functions of the labelled element and a processor to perform other functions of the labelled element. Each labelled element of the examples may be physically separated into two or more interacting and discrete circuits without departing from the scope of the present disclosure. Likewise, the labelled elements of the examples such as in the memory controller 100 of FIG. 2 may be physically combined into more complex circuits without departing from the scope of the present disclosure.

Referring to FIG. 1 and FIG. 2, the memory controller 100 may include a fault predictor 110, an ECC manager 120 (error correcting code manager), and a plurality of ECC engines 130, 132, and 134.

The fault predictor 110 may predict the fault that occurred in the memory device 200, based on the error occurring in the data received from the memory device 200. In other words, from outside the memory device 200, the fault predictor 110 may predict the fault occurring, or that will occur, in the memory device 200, based on the error occurring in the data received from outside, i.e., received from outside the memory device 200 which is outside the memory controller 100.

Figure 3:
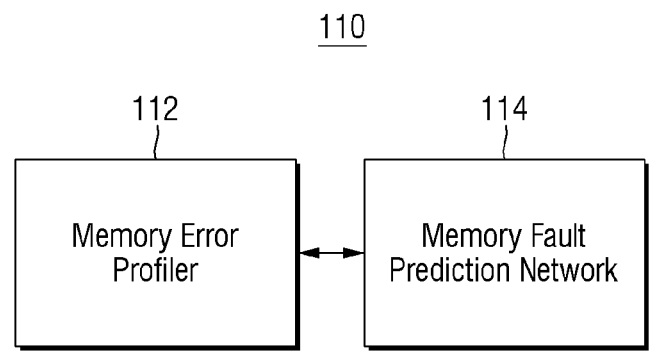
FIG. 3 is an exemplary block diagram showing a fault predictor according to some embodiments.

A detailed description of the fault predictor 110 will be provided through to FIG. 3.

FIG. 3 is an exemplary block diagram showing a fault predictor according to some embodiments.

Referring to FIG. 1 to FIG. 3, the memory controller 100 includes a memory error profiler 112 and a memory fault prediction network 114.

The memory error profiler 112 may receive raw data related to an error occurring in the data received from the memory cell array 210. After that, the memory error profiler 112 may process the raw data into an error profile that is data available to the memory fault prediction network 114 to perform machine learning.

Figure 4:
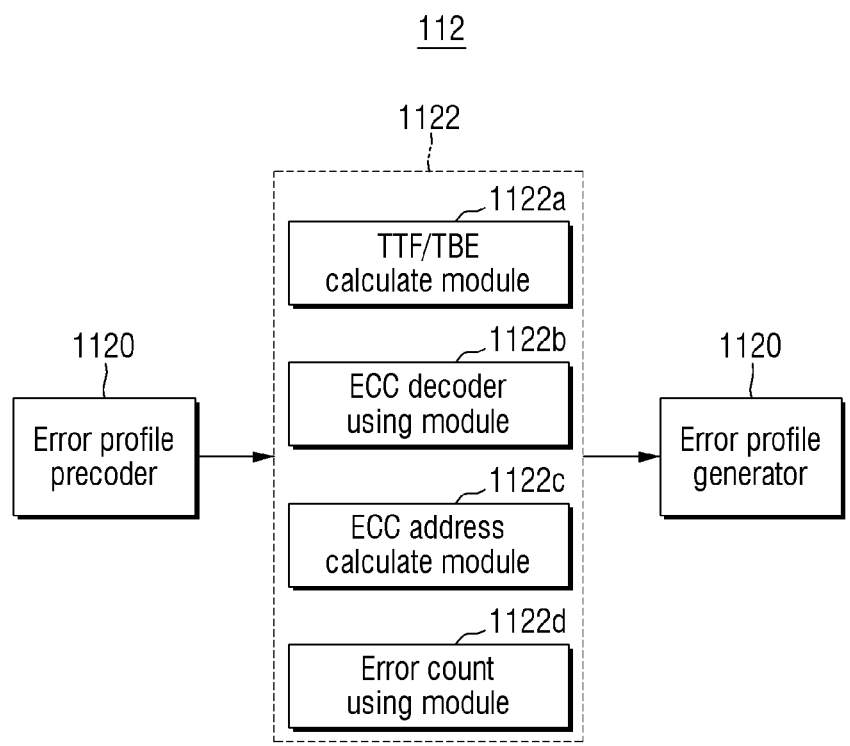
FIG. 4 is an exemplary block diagram showing a memory error profiler according to some embodiments.

A detailed description of the memory error profiler 112 will be provided through FIG. 4.

FIG. 4 is an exemplary block diagram showing a memory error profiler according to some embodiments.

Referring to FIG. 1 to FIG. 4, the memory error profiler 112 may include an error profile precoder 1120, an error information utilizing block 1122, and an error profile generator 1124.

The error profile precoder 1120 may receive raw data related to an error occurring in the data received from the memory device 200.

The raw data may be, for example, raw data related to an error occurring in the data transmitted from the memory system 10, the memory device 200, the memory cell array 210 or the memory controller 100.

The error profile precoder 1120 may precode the raw data to makes the raw data available in at least one of a plurality of error information utilizing modules including the TTF and TBE calculation module 1122a, the ECC decoder utilizing module 1122b, the ECC address calculation module 1122c and the error count utilizing module 1122d included in the error information utilizing block 1122.

When an error address related to the error included in the raw data and occurring in the data received from the memory cell array 210 is in the form of a logical address form, the operation of performing the precoding by the error profile precoder 1120 may include, for example, an operation of converting the error address into a physical address.

For example, the error profile precoder 1120 may precode the raw data and transmit it to a TTF and TBE calculation module 1122a (Time-To-Failure and Time Bet Error calculation module) so that the TTF and TBE calculation module 1122a may calculate a TTF value and a TBE value of the error occurring in the data.

In another example, the error profile precoder 1120 may precode the raw data and transmit it to the ECC decoder utilizing module 1122b so that the ECC decoder utilizing module 1122b may utilize decoding-related information (e.g., error syndrome, number of error bits, etc.) regarding an error occurring in the data.

As another example, the error profile precoder 1120 may precode the raw data and transmit it to the ECC address calculation module 1122c so that the ECC address calculation module 1122c calculates the address regarding the error occurring in the data.

As another example, the error profile precoder 1120 may precode the raw data and transmit it to the error count utilizing module 1122d so that the error count utilizing module 1122d counts the number of occurrence times of an error occurring in the data.

The error information utilizing module included inside the error information utilizing block 1122 is not limited to this drawing.

The error profile generator 1124 may process the information received from the error information utilizing block 1122 into an error profile which is data that is available for the machine learning.

For example, the error profile generator 1124 may generate an error profile obtained by processing the TTF value and the TBE value of the error occurring in the data calculated through the TTF and the TBE calculation module 1122a into data that is available for the machine learning.

As another example, the error profile generator 1124 may generate an error profile obtained by processing the decoding data relating to the error occurring in the data decoded through the ECC decoder utilizing module 1122b into the data that is available for the machine learning.

As another example, the error profile generator 1124 may generate an error profile obtained by processing an address relating to error occurring in the data calculated through the ECC address calculation module 1122c into data that is available for the machine learning.

As another example, the error profile generator 1124 may generate an error profile obtained by processing the number of occurrence times of an error occurring in the data calculated through the error count utilizing module 1122d into data that is available for machine learning.

The error profile is not limited thereto, and may be, for example, an occurrence time of the error occurring in the data, an occurrence interval of the error occurring in the data, an occurrence address of the error occurring in the data, an error pattern based on a syndrome generated on the error occurring in the data, or the number of occurrence times of errors that have occurred and accumulated in the data.

Referring to FIG. 1 to FIG. 3 again, the memory fault prediction network 114 may perform the machine learning, using the error profile received through the memory error profiler 112. The memory error profiler 112 may perform the machine learning by inputting an error profile to predict a fault that occurred in the memory system 10 or the memory device 200. At this time, the memory fault prediction network 114 may utilize additional information relating to an error occurring in the data that may be received from the inside or outside of the memory device 200.

Examples of the networks that are available for the memory fault prediction network 114 to perform the machine learning will be described through FIG. 5 to FIG. 7.

Figure 5:
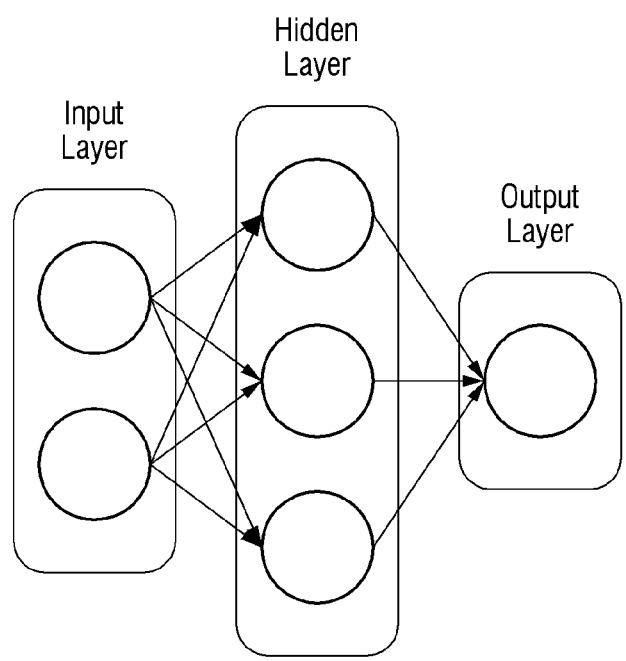
FIG. 5, FIG. 6 and FIG. 7 are exemplary diagrams for explaining the operation of the memory fault prediction network according to some embodiments.
Figure 6:
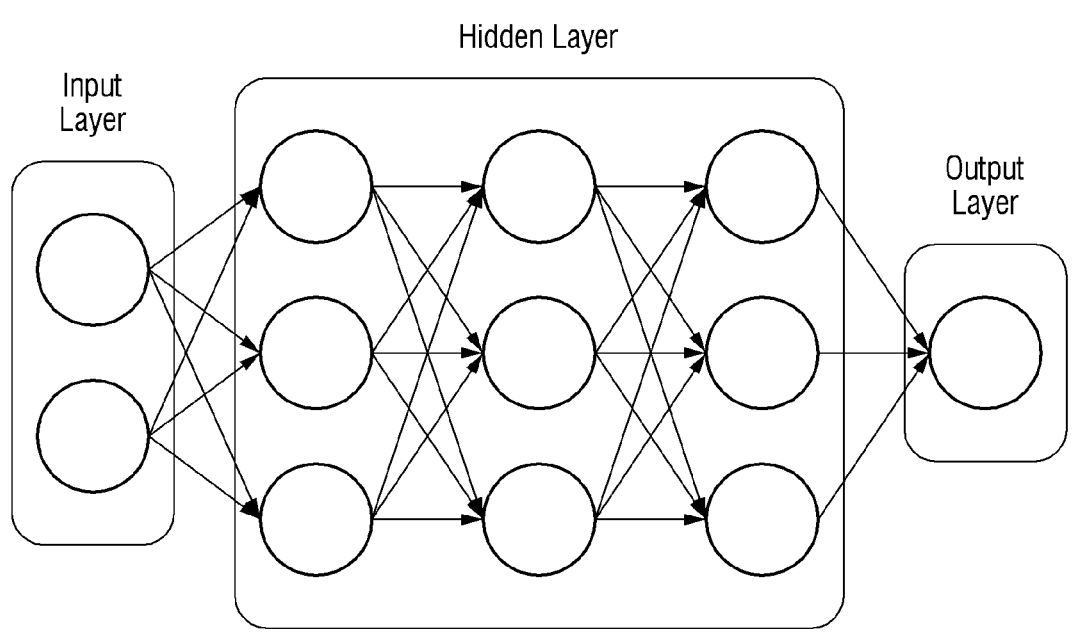
Figure 7:
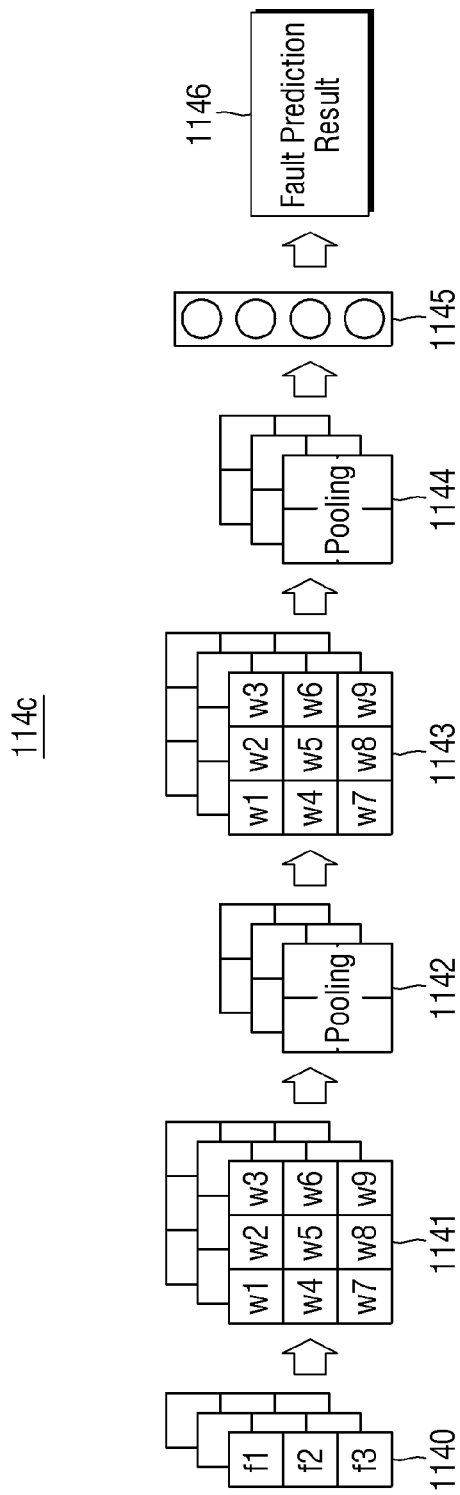

FIG. 5, FIG. 6 and FIG. 7 are exemplary diagrams for explaining the operation of the memory fault prediction network according to some embodiments.

Referring to FIG. 1 to FIG. 5, the memory fault prediction network 114a may perform deep learning, using an artificial neural network.

For example, the memory fault prediction network 114a may predict fault that occurred in the memory system 10 or the memory device 200, by inputting an error profile through a hidden layer formed between an input layer and an output layer.

Referring to FIG. 1 to FIG. 4 and FIG. 6, the memory fault prediction network 114b may perform the deep learning, using an artificial neural network.

For example, the memory fault prediction network 114b may perform deep learning, using a DNN (Deep Neural Network). A fault that occurred in the memory system 10 or the memory device 200 may be predicted, by inputting an error profile through a plurality of hidden layers formed between the input layer and the output layer.

Referring to FIG. 1 to FIG. 4 and FIG. 7, the memory fault prediction network 114c may perform deep learning, using an artificial neural network.

For example, the memory fault prediction network 114c may perform deep learning using a CNN(Convolution Neural Network). A convolution layer 1141 is formed from a first layer 1140 that has received the error profile. At this time, the number of convolution layers 1141 is not limited to this drawing. After that, a pooling layer 1142 is formed from the convolution layer 1141. The convolution layer 1143 may be formed again from the pooling layer 1142. Further, the pooling layer 1144 may be formed through the convolution layer 1143. After that, a pulley connected layer 1145 may be formed through the pooling layer 1144. The number of repetitions of forming the convolution layer and forming the pooling layer is not limited to the number of times of this drawing.

The memory fault prediction network 114c may derive a prediction result 1146 obtained by predicting a fault that will occur in the memory system 10 or the memory device 200 accordingly. The prediction result 1146 may be, for example, a softmax value.

Referring to FIG. 1 and FIG. 2 again, the ECC manager 120 may divide the type of faults based on the fault predicted by the fault predictor 110. Each fault may then be transmitted to the ECC engine 130, 132 or 134 that may correct the fault, depending on the type of faults. For reference, the number of ECC engines 130, 132 and/or 134 shown in this drawing is not limited thereto.

For example, one of a plurality of ECC engines 130, 132 and 134 may perform a demand memory scrubbing operation. The demand memory scrubbing may be performed on single-bit or multi-bit errors. The demand memory scrubbing may be performed on the single-bit error or multi-bit errors, in the process of the host operating system responding to an access to the memory device 200.

As another example, one of the plurality of ECC engines 130, 132, and 134 may perform a patrol memory scrubbing operation. The patrol memory scrubbing operation may be performed independently before an access request to the memory device 200 from the host operating system.

One of a plurality of ECC engines 130, 132 and 134 may correct the fault, using an erasure coding, without being limited thereto. Alternatively, one of the plurality of ECC engines 130, 132, and 134 may fix the fault through sparing.

As another example, one of a plurality of ECC engines 130, 132, and 134 may correct the fault, using the parity bits. This will be described in detail through FIG. 8 to FIG. 10. For reference, it goes without saying that the description of the ECC engine 130 may be applied to other ECC engines 132 and 134.

Figure 8:
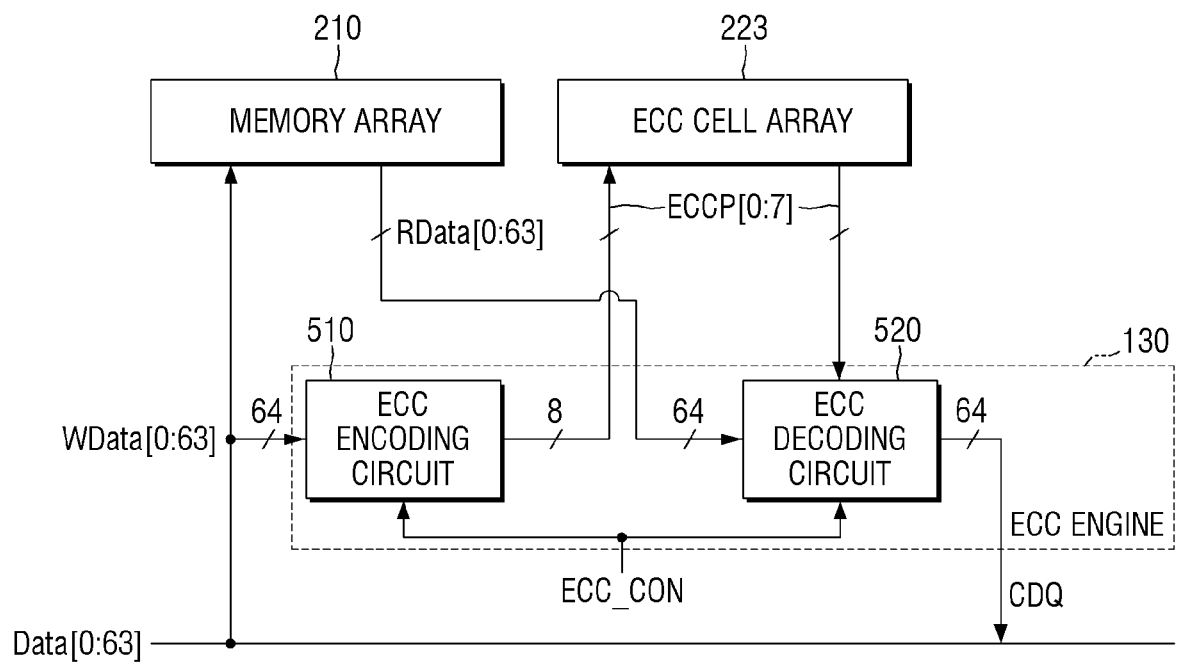
FIG. 8 is an exemplary block diagram for explaining the ECC engine.

FIG. 8 is an exemplary block diagram for explaining the ECC engine.

Referring to FIG. 1 to FIG. 8, the ECC engine 130 may include an ECC encoding circuit 510 and an ECC decoding circuit 520. For reference, it goes without saying that the description of the ECC engine 130 is also applicable to other ECC engines 132 and/or 134.

The ECC encoding circuit 510 may generate parity bits ECCP[0:7] for write data WData[0:63] to be written to the memory cells of the memory cell array 210 in response to an ECC control signal ECC_CON. The parity bits ECCP[0:7] may be stored in the ECC cell array 223. According to an embodiment, the ECC encoding circuit 510 may generate parity bits ECCP[0:7] for write data WData[0:63] to be written to the memory cells including a defective cell of the memory cell array 210 in response to the ECC control signal ECC_CON.

The ECC decoding circuit 520 may correct the error bit data, using the read data RData[0:63] read from the memory cells of the memory cell array 210 and the parity bits ECCP[0:7] read from the ECC cell array 223 in response to the ECC control signal ECC_CON, and may output error-corrected data Data[0:63]. According to the embodiment, the ECC decoding circuit 520 may correct the error bit data, using the read data RData[0:63] read from the memory cells including the defective cell of the memory cell array 210 and the parity bits ECCP[0:7] read from the ECC cell array 223 in response to the ECC control signal ECC_CON, and may output the error-corrected data Data[0:63].

Figure 9:
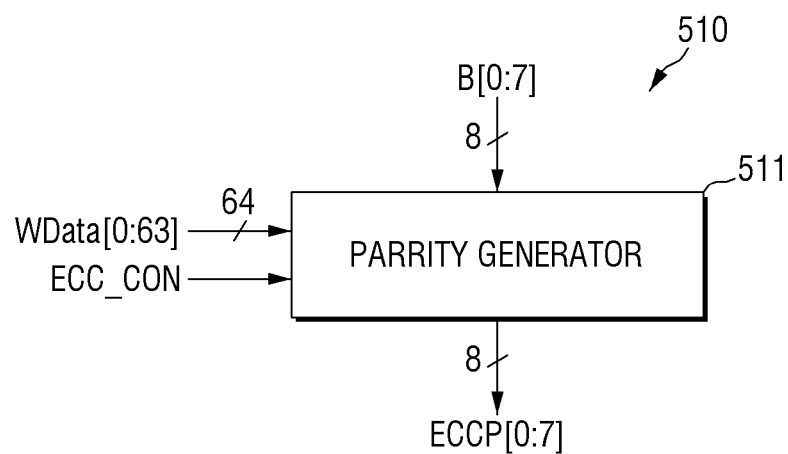
FIG. 9 is an exemplary circuit diagram for explaining the ECC encoding circuit.

FIG. 9 is an exemplary circuit diagram for explaining the ECC encoding circuit.

Referring to FIG. 9, the ECC encoding circuit 510 may include a parity generator 511 that receives 64-bit write data WData[0:63] and basis bits B[0:7] in response to the ECC control signal ECC_CON, and generates the parity bits ECCP[0:7], using the XOR array calculation. The basis bits B[0:7] are bits for generating the parity bits ECCP[0:7] for 64-bit write data WData[0:63], and may be configured by, for example, b'00000000 bits. The basis bit B[0:7] may use other specific bits instead of the b'00000000 bits.

Figure 10:
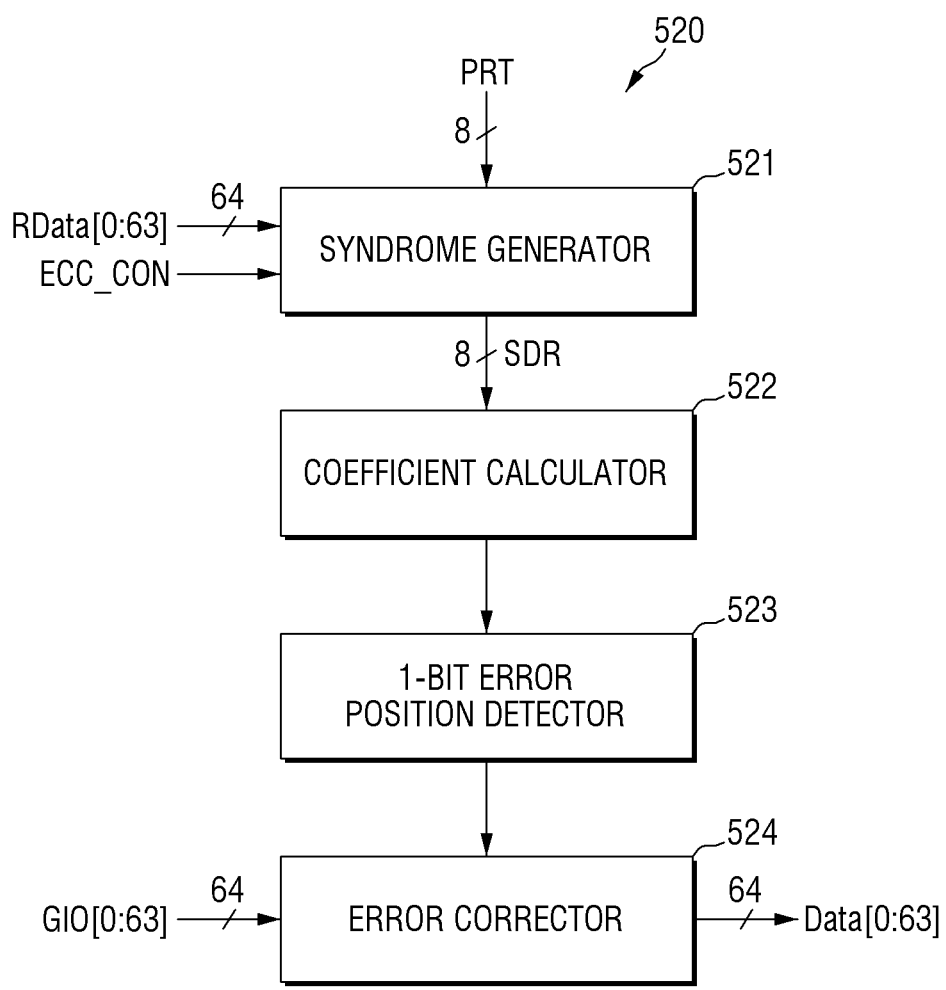
FIG. 10 is an exemplary block diagram for explaining an ECC decoding circuit.

FIG. 10 is an exemplary block diagram for explaining an ECC decoding circuit.

Referring to FIG. 10, the ECC decoding circuit 520 includes a syndrome generator 521, a coefficient calculator 522, a 1-bit error position detector 523, and an error corrector 524. The syndrome generator 521 receives 64-bit read data and 8-bit parity bits ECCP[0:7] in response to the ECC control signal ECC_CON, and may generate syndrome data S[0;7], using the XOR array calculation. The coefficient calculator 522 may calculate the coefficient of the error position equation, using the syndrome data S[0:7]. The error position equation is an equation based on the reciprocal of the error bit. The 1-bit error position detector 523 may calculate the position of the 1-bit error, using the calculated error position equation. The error corrector 524 may determine the 1-bit error position based on the detection result of the 1-bit error position detector 523. The error corrector 524 corrects the error by inverting the logic value of the bit in which the error occurring in the 64-bit read data RData[0:63] according to the determined 1-bit error position information, and may output error-corrected 64-bit data Data[0:63].

Figure 11:
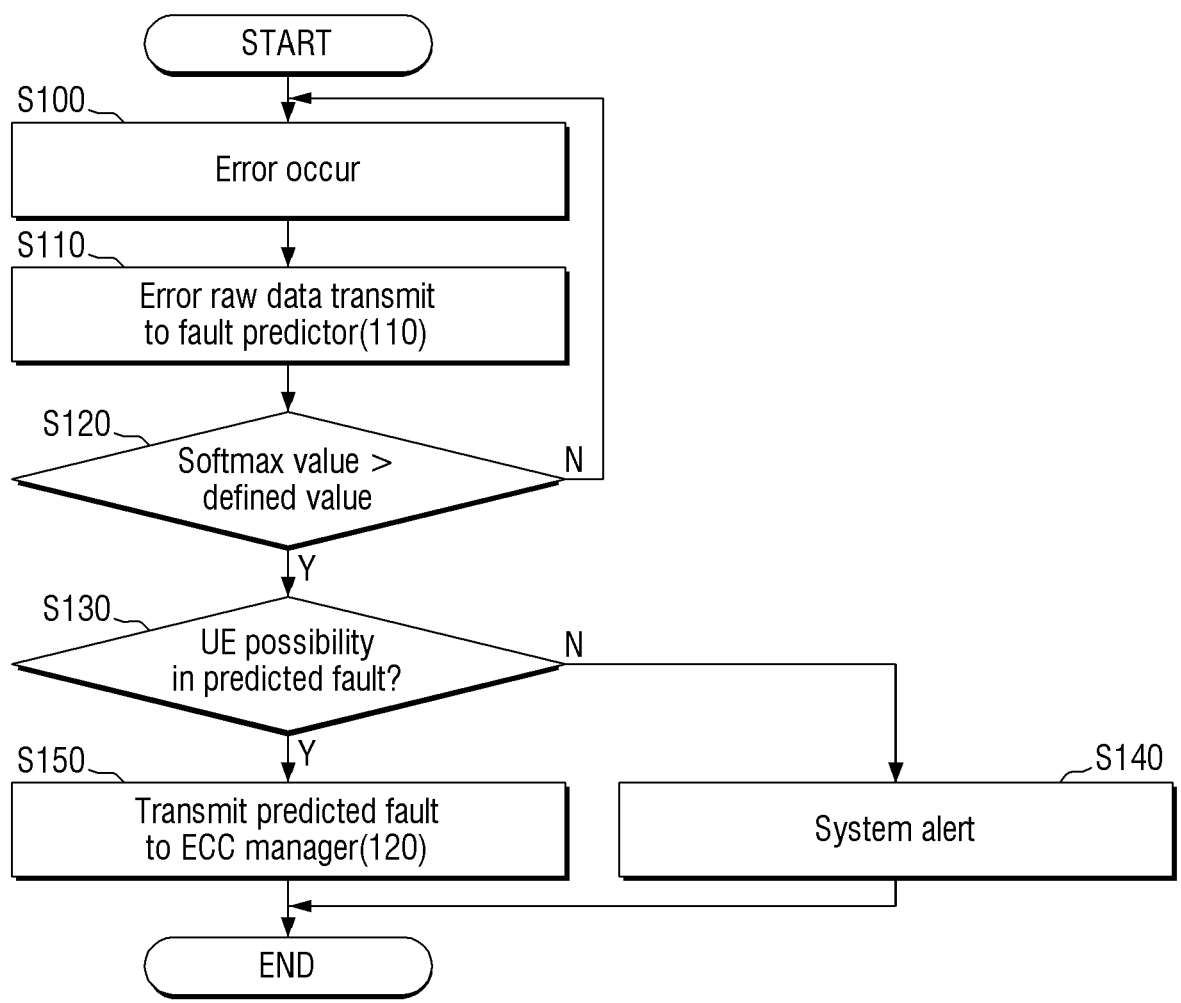
FIG. 11 is an exemplary flowchart for explaining the operation of the memory controller according to some embodiments.

FIG. 11 is an exemplary flowchart for explaining the operation of the memory controller according to some embodiments.

Referring to FIG. 1 to FIG. 4 and FIG. 11, an error may occur in the data stored in the memory cell array 210 (S100).

The fault predictor 110 then receives raw data related to the error occurring in the data (S110). At this time, the fault predictor 110 may predict a fault that causes an error occurring in the data through the raw data. For example, the fault predictor 110 may generate a value that predicts a fault, which causes an error occurring in the data, as a softmax value.

At this time, it is possible to determine whether the softmax value has a value greater than a specified arbitrary value (S120). If it is determined that the softmax value is not greater than specified arbitrary value (N), it is possible to wait until another error occurs. However, if it is determined that the softmax value is greater than the specified arbitrary value (Y), it is determined whether there is an uncorrectable error (UE) possibility in the predicted fault (S130).

At this time, if it is determined that there is an uncorrectable error in the predicted fault (Y), the predicted fault may be transmitted to the ECC manager 120. At the same time, the memory controller 100 may notify the user of the memory system 10 that the predicted fault has an uncorrectable error.

If it is determined that there is no uncorrectable error in the predicted fault (N), the memory controller 100 may transmit the error occurrence fact to the user of the memory system 10.

Figure 12:
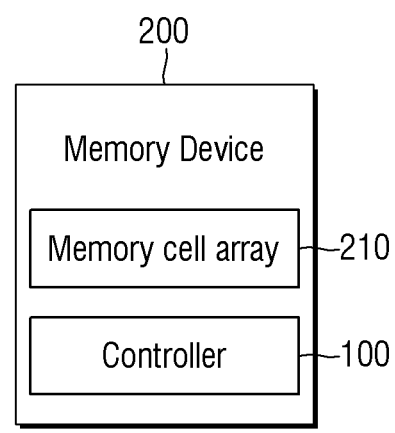
FIG. 12 is an exemplary block diagram for explaining another memory device according to some embodiments.

FIG. 12 is an exemplary block diagram for explaining another memory device according to some embodiments.

Referring to FIG. 12, the memory controller 100 according to some embodiments may be placed inside the memory device 200.

Figure 13:
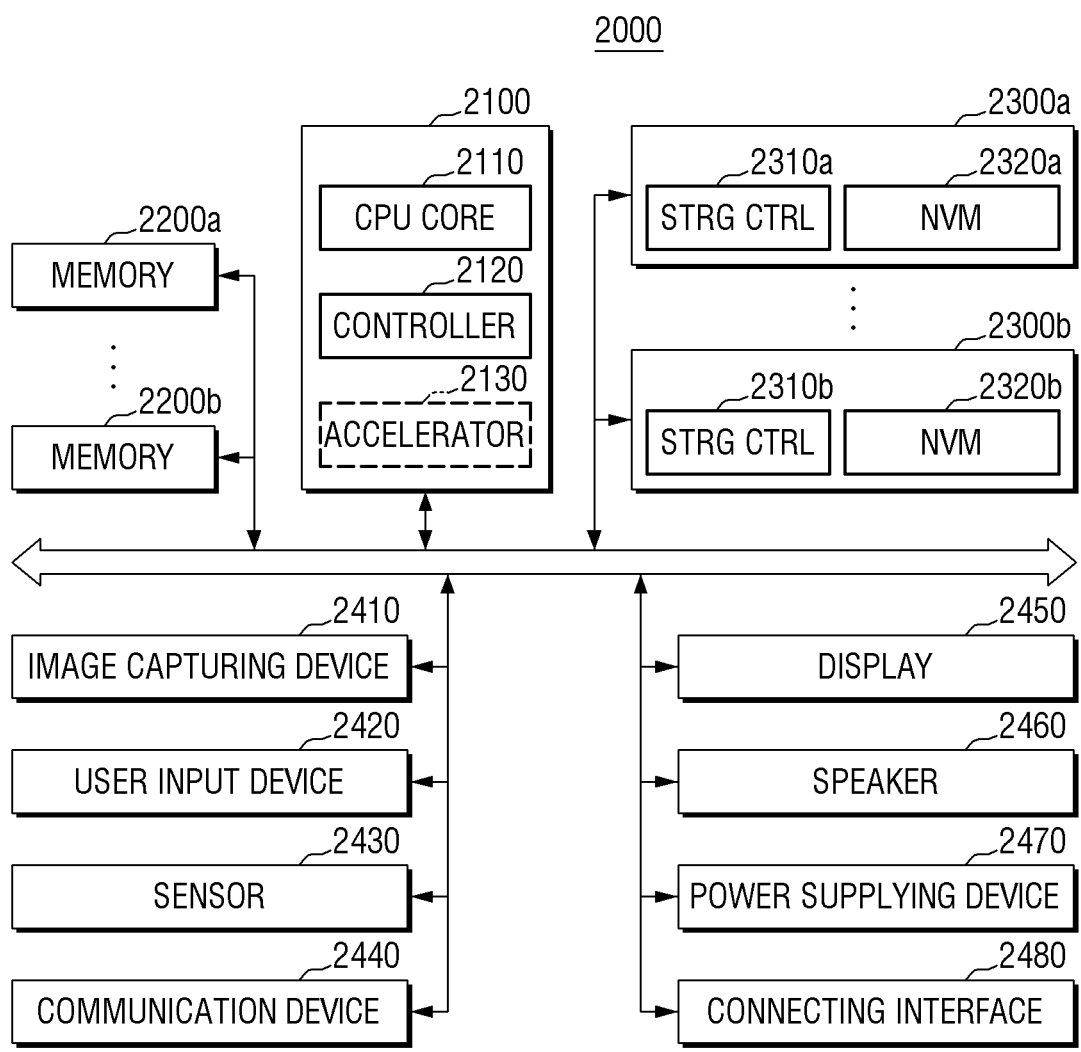
FIG. 13 is an exemplary block diagram for explaining another memory system according to some embodiments.

FIG. 13 is an exemplary block diagram for explaining another memory system according to some embodiments.

Referring to FIG. 13, a memory system 2000 may be basically a mobile system such as a mobile phone, a smart phone, a tablet personal computer (PC), a wearable device, a healthcare device or an IOT (internet of things) device. However, the memory system 2000 of FIG. 13 is not necessarily limited to the mobile system, but may be a personal computer, a laptop computer, a server, a media player or an automotive device such as navigation.

Referring to FIG. 13, the memory system 2000 may include a main processor 2100, memories 2200a and 2200b, and storage devices 2300a and 2300b, and may further include one or more of an image capturing device 2410, a user input device 2420, a sensor 2430, a communication device 2440, a display 2450, a speaker 2460, a power supplying device 2470, and a connecting interface 2480.

The memories 2200a and 2200b may be the memory device 200 described above.

The main processor 2100 may control the overall operation of the memory system 2000, more specifically, the operation of other components that form the memory system 2000. Such a main processor 2100 may be implemented as a general-purpose processor, a dedicated processor, an application processor, or the like.

The main processor 2100 may include one or more CPU cores 2110, and may further include a controller 2120 for controlling the memories 2200a and 2200b and/or the storage devices 2300a and 2300b.

The controller 2120 may be the memory controller 100 described above.

According to embodiments, the main processor 2100 may further include an accelerator 2130, which is a dedicated circuit for high speed data computation such as AI (artificial intelligence) data computation. Such an accelerator 2130 may include a GPA (Graphics Processing Unit), an NPU (Neural Processing Unit), and/or a DPA (Data Processing Unit), and may also be implemented as a separate chip that is physically independent of other components of the main processor 2100.

The memories 2200a and 2200b may be used as a main memory unit of the memory system 2000 and may include a volatile memory such as a SRAM and/or a DRAM, but may also include a non-volatile memory such as a flash memory, a PRAM and/or a RRAM. The memories 2200a and 2200b may also be implemented inside the same package as the main processor 2100.

The storage devices 2300a and 2300b may function as a non-volatile storage device for storing data regardless of the presence or absence of the supply of power source, and may have a relatively large storage capacity as compared with the memories 2200a and 2200b. The storage devices 2300a and 2300b may include storage controllers 2310a and 2310b and non-volatile memories 2320a and 2320b (NVMs) for storing the data under the control of the storage controllers 2310a and 2310b. The non-volatile memories 2320a and 2320b may include flash memory of a 2D (two-dimensional) structure or a 3D (three-dimensional) V-NAND (Vertical NAND) structure, but may also include other types of non-volatile memory such as a PRAM and/or a RRAM.

The storage devices 2300a and 2300b may be included in the memory system 2000 in the state of being physically separated from the main processor 2100, or may be implemented inside the same package as the main processor 2100. Further, the storage devices 2300a and 2300b have a form such as an SSD (solid state device) or a memory card, and thus may be detachably combined with other components of the memory system 2000 through an interface such as a connecting interface 2480 to be described later. Such storage devices 2300a and 2300b may be devices to which standard protocols such as an UFS (Universal Flash Storage), an eMMC (embedded multi-media card) or a NVMe (non-volatile memory express) are applied, but are not necessarily limited thereto.

The image capturing device 2410 may capture a still image or a moving image, and may be a camera, a camcorder, and/or a webcam.

The user input device 2420 may receive various types of data that are input from the user of the memory system 2000, and may be a touch pad, a key pad, a keyboard, a mouse, a microphone or the like.

The sensor 2430 may sense various types of physical quantities that may be acquired from the outside of the memory system 2000 and convert the sensed physical quantities into electrical signals. Such a sensor 2430 may be a temperature sensor, a pressure sensor, an illuminance sensor, a position sensor, an acceleration sensor, a biosensor and/or a gyroscope sensor, and the like.

The communication device 2440 may transmit and receive signals to and from other devices outside the memory system 2000 according to various communication protocols. Such a communication device 2440 may be implemented to include an antenna, a transceiver, and/or a modem and the like.

The display 2450 and the speaker 2460 may function as output devices that output visual and auditory information to the users of the memory system 2000, respectively.

The power supplying device 2470 may appropriately convert the power supplied from a battery (not shown) equipped in the memory system 2000 and/or an external power source, and supply the power to each constituent element of the memory system 2000.

The connecting interface 2480 may provide a connection between the memory system 2000 and an external device that may be connected to the memory system 2000 to transmit and receive data to and from the memory system 2000. The connecting interface 2480 may be implemented in various interface types, such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe, an IEEE 1394, a USB (universal serial bus), an SD (secure digital) card, a MMC (multi-media card), an eMMC, a UFS, an eUFS (embedded Universal Flash Storage), and a CF (compact flash) card interface.

Figure 14:
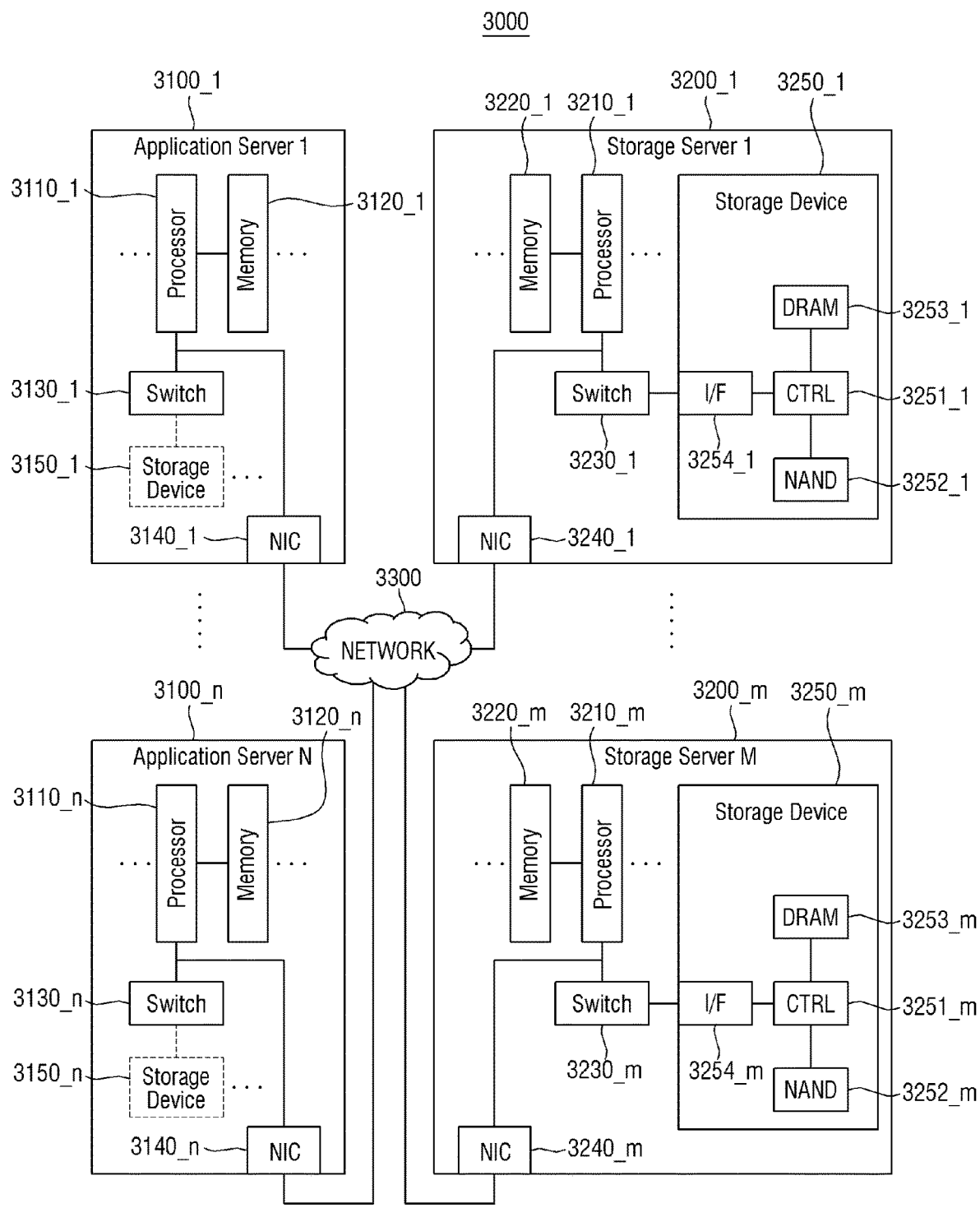
FIG. 14 is an exemplary block diagram for explaining a data center according to some embodiments.

FIG. 14 is an exemplary block diagram for explaining a data center according to some embodiments.

Referring to FIG. 14, a data center 3000 is a facility that gathers various types of data and provides services, and may also be called a data storage center. The data center 3000 may be a system for search engine and database operation, and may be a computing system used by corporations such as banks or government agencies. The data center 3000 may include application servers 3100 to 3100n and storage servers 3200 to 3200m. The number of application servers 3100 to 3100n and the number of storage servers 3200 to 3200m may be variously selected depending on the embodiments, and the number of application servers 3100 to 3100n and the number of storage servers 3200 to 3200m may be different from each other.

The application server 3100 or the storage server 3200 may include at least one of the processors 3110 and 3210 and the memories 3120 and 3220. Taking the storage server 3200 as an example, the processor 3210 may control the overall operation of the storage server 3200, and access the memory 3220 to execute command and/or data loaded into the memory 3220.

The memory 3220 may be a DDR SDRAM (Double Data Rate Synchronous DRAM), a HBM (High Bandwidth Memory), a HMC (Hybrid Memory Cube), a DIMM (Dual In-line Memory Module), an Optane DIMM and/or a NVMDIMM (Non-Volatile DIMM).

The memory 3220 may be the memory device 200 described above

According to the embodiments, the number of processors 3210 and the number of memories 3220 included in the storage server 3200 may be variously selected. In an embodiment, the processor 3210 and the memory 3220 may provide a processor-memory pair. In an embodiment, the number of processors 3210 and the number of memories 3220 may be different from each other. The processor 3210 may include a single core processor or a multi-core processor. The aforementioned explanation of the storage server 3200 may also be similarly applied to the application server 3100. According to the embodiments, the application server 3100 may not include a storage device 3150. The storage server 3200 may include at least one or more storage devices 3250. The number of storage devices 3250 included in the storage server 3200 may be variously selected depending on the embodiments.

As set forth above, prediction accuracy for predicting a fault that occurs in a memory is improved for a memory controller based on an error which occurs in the data.

Prediction accuracy for predicting a fault that occurs in a memory is improved for a memory device based on an error which occurs in the data.

Prediction accuracy for predicting a fault that occurs in a memory is improved for a memory system based on an error which occurs in the data.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. A memory controller, comprising:
a fault predictor which predicts a fault which causes an error occurring in a memory device;
an ECC manager which classifies a type of the fault based on the predicted fault; and
a plurality of ECC engines which perform ECC in parallel depending on the classified type of the fault,
wherein the fault predictor includes
a memory error profiler which receives raw data related to the error and processes the raw data into an error profile that is data available for machine learning, and
a memory fault prediction network which receives the error profile as an input, performs the machine learning using the error profile, and predicts the fault which causes the error.

2. The memory controller of claim 1, wherein the memory error profiler includes
an error profile precoder,
an error information utilizing block including a plurality of error information utilizing modules, and
an error profile generator which processes the data generated through the error information utilizing block into the error profile, and
wherein the error profile precoder precodes the raw data to be available for at least one of the plurality of error information utilizing modules.

3. The memory controller of claim 2, wherein at least one of the plurality of error information utilizing modules is a TTF (Time-To-Failure) and TBE (Time Bet Error) calculation module.

4. The memory controller of claim 2, wherein at least one of the plurality of error information utilizing modules is an ECC decoder utilizing module.

5. The memory controller of claim 2, wherein at least one of the plurality of error information utilizing modules is an ECC address calculation module.

6. The memory controller of claim 2, wherein at least one of the plurality of error information utilizing modules is an error count utilizing module.

7. The memory controller of claim 1, wherein the ECC manager receives the predicted fault and transmits the predicted fault to a first ECC engine among the plurality of ECC engines, and
the first ECC engine performs ECC based on the predicted fault.

8. The memory controller of claim 7, wherein the first ECC engine performs error scrubbing.

9. The memory controller of claim 1, wherein the memory fault prediction network predicts the fault, using a CNN (Convolution Neural Network).

10. A memory device, comprising:
a memory cell array which includes a plurality of memory cells for storing data; and
a memory controller which controls an access to the memory cell array,
wherein the memory controller includes
a fault predictor which includes a memory error profiler that receives raw data related to an error occurring in the data and processes the raw data into an error profile that is data available for machine learning, and a memory fault prediction network that receives the error profile as an input and performs the machine learning using the error profile to predict a fault that causes the error, and
an ECC manager which classifies a type of the fault based on the predicted fault.

11. The memory device of claim 10, wherein the memory error profiler includes
an error profile precoder,
an error information utilizing block including a plurality of error information utilizing modules, and
an error profile generator which processes data generated through the error information utilizing block into the error profile, and
the error profile precoder precodes the raw data to be available for at least one of the plurality of error information utilizing modules.

12. The memory device of claim 11, wherein at least one of the plurality of error information utilizing modules is a TTF (Time-To-Failure) and TBE (Time Bet Error) calculation module, an ECC decoder utilizing module, an ECC address calculation module or an error count utilizing module.

13. The memory device of claim 10, wherein the ECC manager receives the predicted fault and transmits the predicted fault to a first ECC engine among a plurality of ECC engines, and
the first ECC engine performs ECC based on the predicted fault.

14. The memory device of claim 13, wherein the first ECC engine performs error scrubbing.

15. The memory controller of claim 10, wherein the memory fault prediction network predicts the fault, using a CNN(Convolution Neural Network).

16. A memory system, comprising:
a memory device which includes a memory cell array including a plurality of memory cells for storing data; and
a memory controller which includes a fault predictor that predicts a fault that causes an error occurring in the memory device, an ECC manager that classifies a type of the fault based on the predicted fault, and a plurality of ECC engines that perform ECC in parallel depending on the classified type of the fault,
wherein the fault predictor includes a memory error profiler that receives raw data related to an error occurring in the data and processes the raw data into an error profile that is data available for machine learning, and a memory fault prediction network that receives the error profile as an input and performs the machine learning using the error profile to predict a fault that causes the error.

17. The memory system of claim 16, wherein the memory error profiler includes an error profile precoder, an error information utilizing block including a plurality of error information utilizing modules, and an error profile generator which processes the data generated through the error information utilizing block into the error profile, and the error profile precoder precodes the raw data to be available for at least one of the plurality of error information utilizing modules.

18. The memory system of claim 17, wherein the ECC manager receives the predicted fault and transmits the predicted fault to a first ECC engine among the plurality of ECC engines, and the first ECC engine performs ECC based on the predicted fault.

19. The memory system of claim 18, wherein the first ECC engine performs error scrubbing.

20. The memory controller of claim 16, wherein the memory fault prediction network predicts the fault, using a CNN(Convolution Neural Network).

\* \* \* \* \*